(12) United States Patent
Li et al.

(10) Patent No.: US 8,841,943 B2
(45) Date of Patent: Sep. 23, 2014

(54) CURRENT DRIVER DAMPING CIRCUIT

(75) Inventors: Shengyuan Li, Irving, TX (US);
Douglas Warren Dean, Eagan, MN (US); Indumini Ranmuthu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 607 days.

(21) Appl. No.: 13/118,242

(22) Filed: May 27, 2011

(65) Prior Publication Data

US 2012/0300606 A1 Nov. 29, 2012

(51) Int. Cl.
*H03B 1/00* (2006.01)
*H01S 5/042* (2006.01)

(52) U.S. Cl.
CPC ........................................ *H01S 5/042* (2013.01)
USPC ........................................................ 327/109

(58) Field of Classification Search
None
See application file for complete search history.

(56) References Cited

U.S. PATENT DOCUMENTS

| | | | | |
|---|---|---|---|---|
| 5,469,094 A | * | 11/1995 | Nessi | 327/110 |
| 6,329,872 B1 | * | 12/2001 | Foroudi | 327/541 |
| 7,193,453 B2 | * | 3/2007 | Wei et al. | 327/538 |
| 7,944,251 B2 | * | 5/2011 | Chen et al. | 327/108 |

OTHER PUBLICATIONS

U.S. Appl. No. 12/758,160, filed Apr. 12, 2010.

* cited by examiner

*Primary Examiner* — Lincoln Donovan
*Assistant Examiner* — Khareem E Almo
(74) *Attorney, Agent, or Firm* — Alan A. R. Cooper; Frederick J. Telecky, Jr.

(57) ABSTRACT

Various apparatuses, methods and systems for damping a current driver are disclosed herein. For example, some embodiments provide an apparatus for supplying current, including an output transistor connected between a voltage supply and a current output, and an active clamp connected between the current output and a current sink. The active clamp is adapted to connect the current output to the current sink when a voltage at the current output reaches a predetermined state relative to a voltage at a control input of the output transistor.

18 Claims, 4 Drawing Sheets

CURRENT DRIVER DAMPING CIRCUIT

BACKGROUND

Many types of electronic devices rely on current drivers to provide a regulated level of electrical current. For example, current drivers are commonly used to power laser diodes and light emitting diodes, which perform best when supplied with a regulated or constant current. For high current applications requiring changing current levels, it can be difficult to avoid overshoot when changing the output current level without sacrificing current capability. To achieve fast current driving speed and save semiconductor die area, a bipolar transistor may be used as the output driver device, offering high current capability with high speed operation. However, in applications with low voltage headroom for the current driver, the bipolar transistor approaches the saturation region where it performs more slowly. For example, with laser diodes having a large turn-on voltage the large voltage swing required at the output of the current driver may approach the supply voltage for the current driver, reducing the voltage headroom for the current driver. In addition, inductive loading from electrical conductors such as package bondwire and leadframe, PCB trace, and flex trace can cause ringing at the output of the current driver, increasing the risk of forcing the bipolar output driver device into saturation where it performs slowly.

SUMMARY

Various apparatuses, methods and systems for damping a current driver are disclosed herein, enabling high speed current driving with low headroom voltage requirements and limited overshoot. For example, some embodiments provide an apparatus for supplying current, including an output transistor connected between a voltage supply and a current output, and an active clamp connected between the current output and a current sink such as a ground. The active clamp is adapted to connect the current output to the current sink when a voltage at the current output reaches a predetermined state relative to a voltage at a control input of the output transistor, for example when the voltage at the current output is greater than or equal to the voltage at the control input of the output transistor or would cause the output transistor to operate in saturation mode. In some embodiments, the active clamp includes various combinations of one or more of the following devices: a second transistor connected between the current output and the current sink, a resistor connected between the voltage supply and the current output, a buffer connected to the control input of the output transistor, a capacitor connected between the current output and a control input of the second transistor, a resistor connected between the control input of the second transistor and the current sink, an amplifier connected to the current output and to the control input of the output transistor and having an output connected to a control input of the second transistor. In some embodiments, the amplifier comprises a current mirror connected to a reference voltage generator that tracks the voltage at the control input of the output transistor. In some embodiments, the active clamp includes a diode-connected transistor connected between the control input of the second transistor and the current sink, with the emitter of the second diode-connected transistor connected to the control input of the second transistor. The diode-connected transistor in some embodiments is an NPN transistor, with the emitter comprising an inner N-doped semiconductor layer. In some embodiments, the active clamp includes an electrostatic discharge protection circuit to disable the active clamp during an electrostatic discharge event. Some embodiments include a resistor connected between the base and emitter of the second transistor, a level-shifting transistor connected between the control input of the second transistor and the control input of the output transistor, and a bias current supply connected to the control input of the second transistor.

Other embodiments provide a method for supplying electrical current, including controlling a current between a voltage input and a current output with a current output transistor between the voltage input and the current output, comparing a voltage at a control input of the current output transistor with a voltage at the current output, and, when the voltage at the current output reaches a level relative to the voltage at the control input of the current output transistor, adjusting the voltage at the current output to keep the current output transistor operating in an active region. Some embodiments lower the voltage at the current output by sinking current from the current output. Some embodiments also inhibit the adjustment of the voltage at the current output during an electrostatic discharge event. Some embodiments also deactivate the adjustment of the voltage at the current output during steady state operation.

Other embodiments provide an optical media storage device including an optical pick-up unit connected to a current supply. The current supply includes an output transistor connected between a voltage supply and a current output, and an active clamp connected between the current output and a current sink. The active clamp is operable to prevent the output transistor from entering a saturation region, in some cases by connecting the current output to the current sink when a voltage at the current output is greater than or equal to a voltage at a control input of the output transistor.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DETAILED DESCRIPTION

The drawings and description, in general, disclose various embodiments of a current driver damping circuit that may be used with current drivers to damp overshoot such as that caused by ringing. Examples of current drivers that may benefit from use of the current driver damping circuit include high-side current drivers used in the optical pick-up unit of an optical media storage device, for example to supply current to a laser diode. The current driver damping circuit enables the use of a relatively fast bipolar junction transistor (BJT) as the output device in an application with low voltage headroom in the driver, while preventing overshoot from forcing the BJT output device from entering the slower saturation region.

Figure 1:
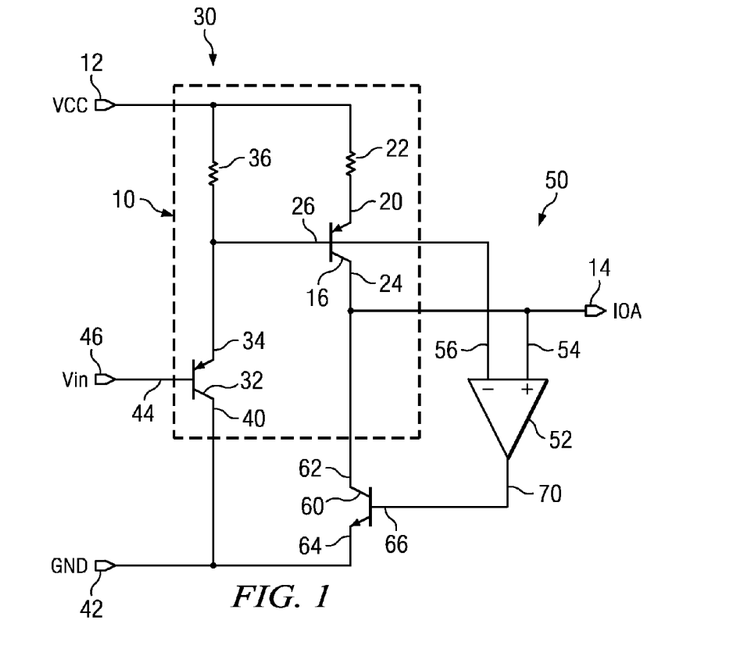
FIG. 1 depicts a current driver with an active clamp in accordance with some embodiments.

A simplified circuit diagram of one embodiment of a current driver damping circuit is illustrated in FIG. 1. In this example, a high-side output driver 10 sources current from a voltage supply 12 to a current output 14, to which a load (not shown) such as a laser diode may be connected. An output transistor 16 such as a PNP BJT is connected at an emitter 20 to the voltage supply 12 through a resistor 22. The resistor 22 is used as degeneration to improve matching. The collector 24 of the output transistor 16 is connected to the current output 14. The base 26 of the output transistor 16 is pulled low to turn on the output transistor 16 and allow current to flow to the current output 14, or pulled high to turn off the output transistor 16. A buffer 30 or input stage may be used to control the base 26 of the output transistor 16, including for example a PNP BJT transistor 32 with the emitter 34 connected to the voltage supply 12 through resistor 36, with the collector 40 connected to ground 42, and with the base 44 connected to a control input 46.

The output driver 10 is controlled by control input 46. To turn on the current output 14, control input 46 is pulled low, which turns on transistor 32 and pulls base 26 of output transistor 16 to ground 42, turning on output transistor 16 and allowing current to flow from the voltage supply 12 to current output 14. To turn off the current output 14, control input 46 is pulled high, which turns off transistor 32 and allows base 26 of output transistor 16 to be pulled high through resistor 36, turning off output transistor 16. The output driver 10 sources current to a load (not shown) through current output 14, with a ground or current sink used at the other side of the load (not shown) to complete the circuit. When the current output 14 is turned off, the voltage at the current output 14 briefly experiences "overshoot", a rising voltage excursion in response to a negative going change in output current. When the current output 14 is turned off, briefly experiences "undershoot", a falling voltage excursion in response to a positive going change in output current. The damping circuits disclosed herein may be adapted to compensate for either or both overshoot and undershoot in order to keep the output transistor 16 operating in the active region and prevent it from entering the slower saturation region.

An active clamp 50 provides a damping circuit to prevent the base to collector voltage $V_{BC}$ for the output transistor 16 from dropping and causing the output transistor 16 to operate in the saturation region, which is substantially slower than the active region of normal operation. Notably, the circuits disclosed herein, including the output driver 10 and various embodiments of the active clamp 50, may be adapted to other types of transistors and polarities, for example using CMOS transistors or swapping NPN for PNP transistors and vice versa. Similarly, reference voltage nodes such as the voltage supply 12 and the ground 42 are not limited to any particular voltages. For example, the ground 42 is also referred to herein as a current sink and is not necessarily tied to an absolute ground or to any particular voltage level. In some embodiments, the ground 42 may be at a higher voltage than the voltage supply 12. The example embodiments provided herein illustrate a high side current source in which the output transistor 16 is a PNP BJT may be pulled into the saturation region by overshoot, with an active clamp provided to damp overshoot and keep the output transistor 16 in the active region. In other embodiments with a low side current source, an NPN BJT may be pulled into the saturation region by undershoot, with an active clamp adapted to damp the undershoot.

In the example embodiment of FIG. 1, the active clamp 50 ensures that the output transistor 16 operates in the active region by comparing the voltage at the base 26 of the output transistor 16 with the voltage at the current output 14 or at the collector 24 of the output transistor 16 and by stealing current away from the current output 14 if the voltage at the collector 24 reaches the voltage at the base 26. The active clamp 50 thus damps the voltage at the current output 14 when the output transistor 16 would otherwise enter the saturation region. The active clamp 50 includes an amplifier 52 having a non-inverting input 54 connected to the current output 14 and an inverting input 56 connected to the base 26 of the output transistor 16. A current stealing transistor 60 such as an NPN BJT is connected between the output transistor 16 and the ground 42 with the collector 62 connected to the collector 24 of the output transistor 16 and the emitter 64 connected to ground 42. The base 66 of transistor 60 is connected to the output 70 of the amplifier 52. When the voltage at the current output 14 rises to roughly the voltage at the base 26 of the output transistor 16, the voltage at the output 70 of the amplifier 52 rises, turning on transistor 60 and sinking current from the current output 14 to ground 42. This lowers the voltage at the collector 24 of the output transistor 16, keeping it below the voltage at the base 26 of the output transistor 16 so that output transistor 16 operates in the active region.

During operation, when the control input 46 is pulled low, transistor 32 turns on, pulling the base 26 of output transistor 16 low and turning on the output transistor 16 and sourcing current to the current output 14. When the control input 46 is pulled high, transistor 32 turns off, pulling the base 26 of output transistor 16 high through resistor 36 and turning off the output transistor 16. In either case, if ringing or voltage oscillation causes the voltage at the collector 24 of the output transistor 16 to rise to the level at the base 26, the active clamp 50 pulls down the voltage at the collector 24 to keep the output transistor 16 in the active region of operation. When the output driver 10 is used to drive a load such as an off-chip laser diode having a large voltage drop, the voltage headroom in the output driver 10 is minimized, and voltage swings due to ringing at the current output 14 approach the level that would force the output transistor 16 into saturation without the active clamp 50, particularly when using high impedance connections such as flex traces between the output driver 10 and the load.

Figure 2:
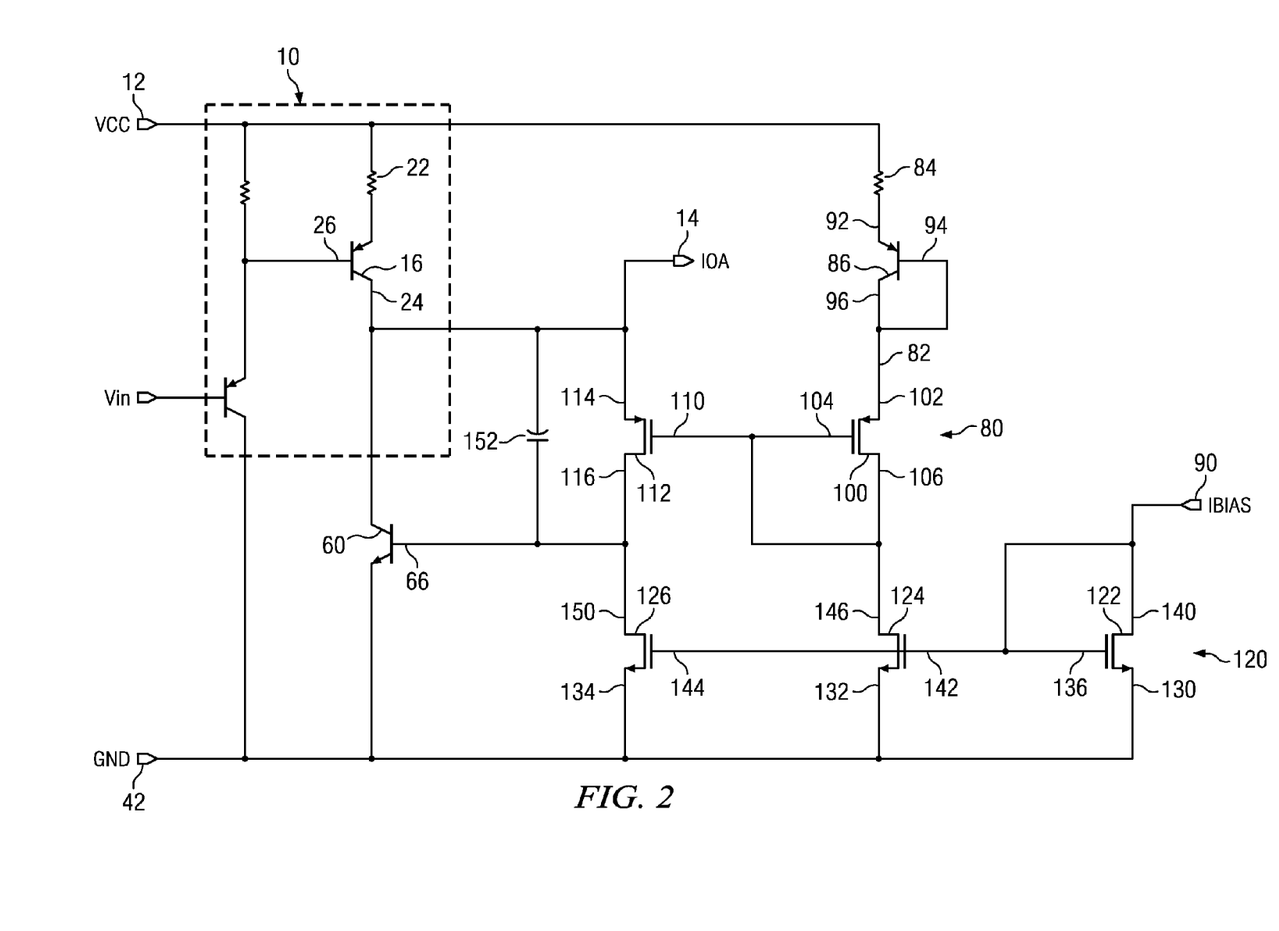
FIG. 2 depicts a current driver with an active clamp, wherein the active clamp includes a current mirror amplifier in accordance with some embodiments.

Referring now to FIG. 2, in some embodiments an active clamp includes a current mirror 80 to perform the comparison between the voltage at the current output 14 and the voltage at the base 26 of the output transistor 16, using a reference voltage at a node 82 that tracks the voltage at the base 26 of the output transistor 16. The reference voltage is generated using a resistor 84 and a diode-connected transistor 86, with the current through node 82 controlled by a bias current supply 90 that tracks the current through the output transistor 16. Resistor 84 is connected between voltage supply 12 and the emitter 92 of diode-connected transistor 86. The base 94 and collector 96 of diode-connected transistor 86 are connected to the reference voltage node 82. In this example, diode-connected transistor 86 is a PNP BJT transistor having an emitter area proportional to the emitter area of output transistor 16, and resistor 84 is proportional to resistor 22. This, in combination with the bias current supply 90 that tracks the current through output transistor 16, causes reference voltage node 82 to track the voltage at the base 26 of output transistor 16. The bias current supply 90 may use any suitable circuit or device for tracking the current through output transistor 16.

Current mirror 80 includes a diode-connected P-channel CMOS transistor 100 having a source 102 connected to reference voltage node 82 and having a gate 104 and drain 106 connected to the gate 110 of mirror P-channel CMOS transistor 112. The source 114 of transistor 112 is connected to current output 14, and the drain 116 is connected to the base 66 of current stealing transistor 60.

The bias current from bias current supply 90 is mirrored to the legs of current mirror 80 by current mirror 120, which includes diode-connected NMOS transistor 122 and NMOS transistors 124 and 126. The sources 130, 132 and 134 of transistors 122, 124 and 126 are connected to ground 42. The gate 136 and drain 140 of transistor 122 are connected to bias current supply 90 and to the gates 142 and 144 of transistors 124 and 126. The drain 146 of transistor 124 is connected to the drain 106 of transistor 100, and the drain 150 of transistor 126 is connected to the drain 116 of transistor 112. The source 102 of transistor 100 at reference voltage node 82 forms the non-inverting amplifier input, and the source 114 of transistor 112 at current output 14 forms the inverting amplifier input to compare the voltage at the base 26 of output transistor 16 (mirrored at reference voltage node 82) with the voltage at current output 14. The drain 116 of transistor 112 operates as the amplifier output and is connected to the base 66 of current stealing transistor 60.

In some embodiments, a feedforward capacitor 152 is connected between current output 14 and the base 66 of current stealing transistor 60, speeding up the comparison by providing a feedforward path. Feedforward capacitor 152 provides AC coupling from current output 14 to the base 66 of current stealing transistor 60, so that rising voltages at current output 14 due to ringing will be quickly coupled to the base 66 of current stealing transistor 60 to turn it on and rapidly lower the voltage at current output 14, preventing output transistor 16 from entering saturation.

Figure 3:
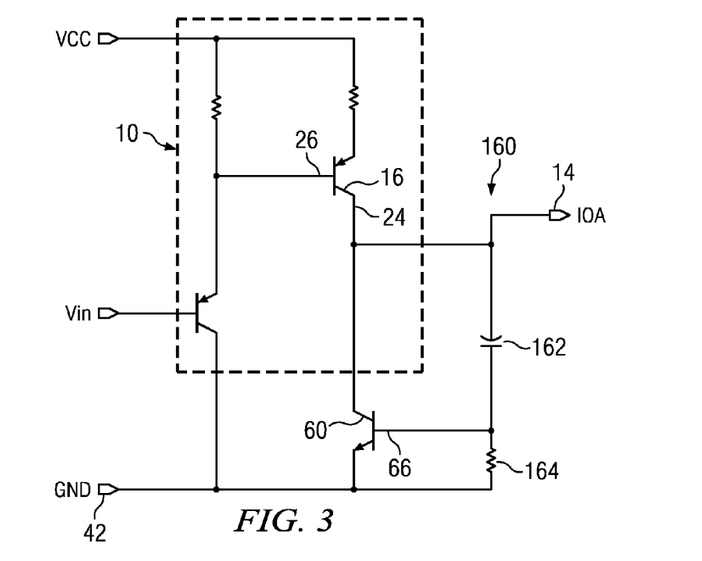
FIG. 3 depicts a current driver with an active clamp, wherein the active clamp includes a feedforward capacitor in accordance with some embodiments.

Referring now to FIG. 3, another embodiment of an active clamp 160 relies on a feedforward capacitor 162 connected between the current output 14 and the base 66 of current stealing transistor 60 to turn on current stealing transistor 60 and prevent output transistor 16 from entering the saturation region. A resistor 164 is connected between the base 66 of current stealing transistor 60 and ground 42, pulling the base 66 down and turning off current stealing transistor 60 during normal operation. In this embodiment, the current stealing transistor 60 is turned on briefly each time there is a rising voltage at current output 14. While this embodiment does not directly monitor the $V_{BC}$ of output transistor 16, current stealing transistor 60 is turned on each time the voltage at collector 24 rises by AC coupling the current output 14 to the base 66 of current stealing transistor 60 through feedforward capacitor 162. This keeps the voltage at the collector 24 of output transistor 16 down to prevent it from entering saturation. The current stealing transistor 60 is then turned off in steady state operation by pulldown resistor 164. The values of feedforward capacitor 162 and resistor 164 may be selected to set the delay of turning current stealing transistor 60 on and off, balancing factors such as minimizing current loss through current stealing transistor 60 and providing rapid response at the current output 14 to state changes, while keeping output transistor 16 in the active region based on the ringing frequency, which may be affected by the characteristic impedance of conductors connected to the current output 14. For example, in one embodiment designed to drive a laser diode, the values may be selected by considering that C1 is the capacitance of feedforward capacitor 162 and C2 is the capacitance between base 66 of current stealing transistor 60 and ground 42. When current output 14 changes by $\Delta V$, the change to the voltage at base 66 is $(C1/(C1+C2))*\Delta V$. The laser diode will have a voltage drop V1 at one output current level, for example, Iout1, and another voltage drop V2 for another output current level Iout2. Given the $\Delta V$ at the two current levels Iout1 and Iout2, the I-V characteristics of current stealing transistor 60, i.e., its collector current vs base emitter voltage, can be tracked and C1 can be selected to couple the proper $\Delta V$ to base 66 to turn it on at the point that will keep output transistor 16 in saturation while minimizing current loss through current stealing transistor 60.

Figure 4:
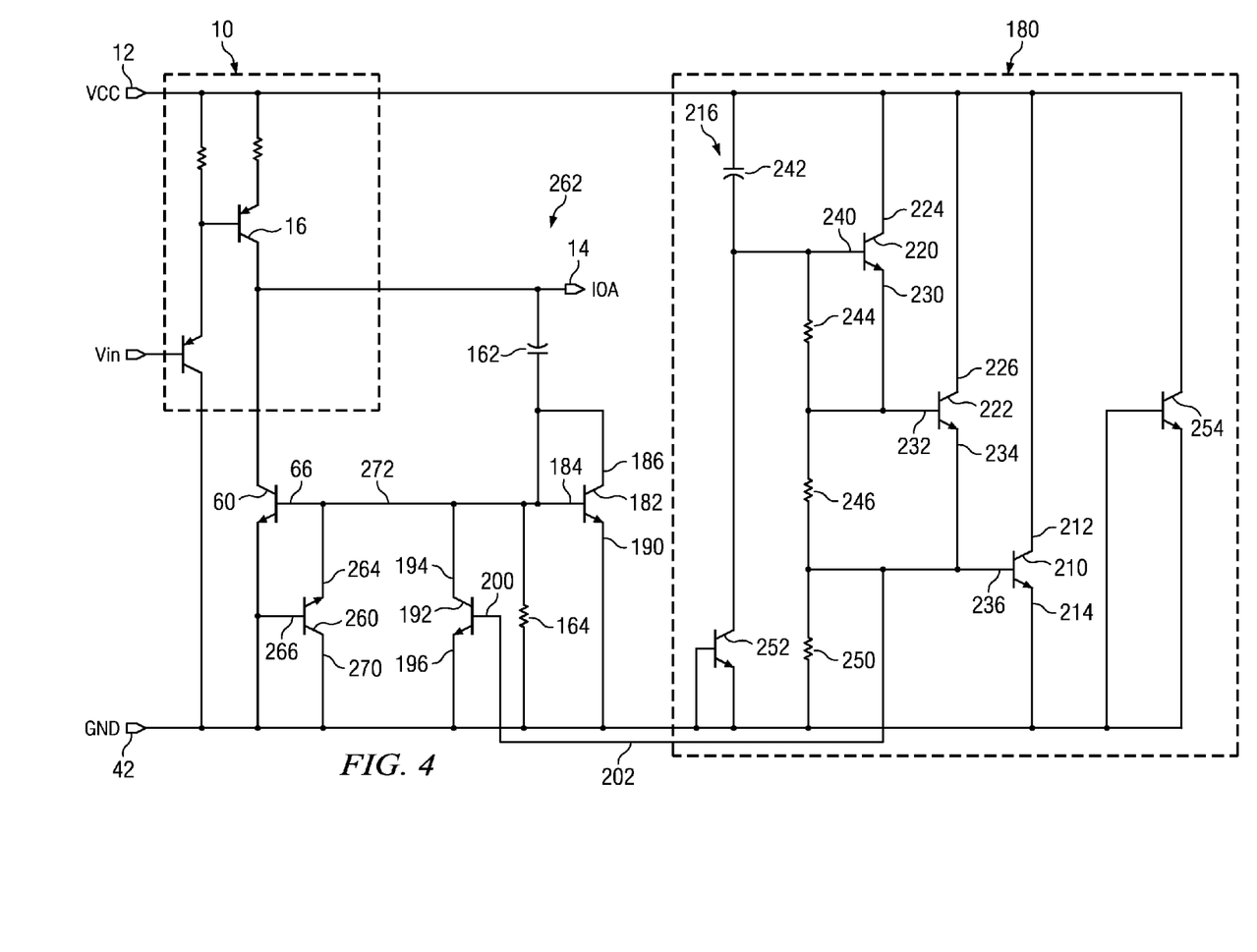
FIG. 4 depicts a current driver with an active clamp, wherein the active clamp includes a feedforward capacitor with current amplification and wherein the active clamp is disabled during electrostatic discharge events in accordance with some embodiments.

Referring now to FIG. 4, an embodiment is illustrated including an electrostatic discharge (ESD circuit) 180. In this embodiment, a feedforward capacitor 162 and resistor 164 are used to control the current stealing transistor 60 to keep the output transistor 16 operating in the active region. The feedforward capacitor 162 is connected between the current output 14 and the base 66 of current stealing transistor 60, AC coupling the current output 14 to the base 66 of current stealing transistor 60. A resistor 164 is connected between the base 66 of current stealing transistor 60 and ground 42, pulling the base 66 down and turning off current stealing transistor 60 during steady state operation.

In this embodiment, the AC current flowing through feedforward capacitor 162 is sensed and amplified in current stealing transistor 60 to pull down the voltage at current output 14 more rapidly. Diode-connected NPN BJT transistor 182 is connected at base 184 and collector 186 to the feedforward capacitor 162 and to the base 66 of current stealing transistor 60, and at emitter 190 to ground 42. Transistor 182 thus forms a current mirror with current stealing transistor 60, with the current flowing through feedforward capacitor 162 as the source or master current. By increasing the emitter area of current stealing transistor 60 with respect to diode-connected transistor 182, the current through current stealing transistor 60 is amplified with respect to the current through feedforward capacitor 162. In one example, the emitter area of current stealing transistor 60 is eight times larger than the emitter area of diode-connected transistor 182, although the ratio between transistors 60 and 182 may be set at any desired level to control the current through current stealing transistor 60. Capacitor 162 and transistors 192 and 60 perform as a capacitive multiplier, so for example if the emitter area of current stealing transistor 60 is eight times larger than the emitter area of diode-connected transistor 182, the current through current stealing transistor 60 is roughly nine times larger than the current at current output 14.

To prevent false triggering of the current stealing transistor 60 during an ESD event, pulldown transistor NPN BJT 192 may be connected between the base 66 of current stealing transistor 60 and ground 42, with the collector 194 connected to base 66 and the emitter 196 connected to ground 42. (Again, the type and polarity of transistors disclosed herein are merely examples and may be adapted as desired.) The base 200 of transistor 192 is connected to an ESD indicator signal 202 from the ESD circuit 180 that is asserted or pulled high during an ESD event, turning on transistor 192 and pulling the base 66 of current stealing transistor 60 low. This ensures that current stealing transistor 60 remains off during an ESD event, preventing false triggering.

The ESD circuit 180 may comprise any circuit for detecting an ESD event, and is not limited to the example of FIG. 4. However, for the purposes of illustration, the example ESD circuit 180 will be briefly described. An NPN BJT transistor 210 is used to short between the voltage supply 12 and ground 42 during an ESD event, and has the collector 212 connected to the voltage supply 12 and the emitter 214 connected to ground 42. The transistor 210 is triggered or turned on during an ESD event by a chain of pullup NPN BJT transistors 220 and 222 and turned off during normal operation by an RC circuit 216. The collectors 224 and 226 of transistors 220 and 222 are connected to the voltage supply 12. The emitter 230 of transistor 220 is connected to the base 232 of pullup transistor 222. The emitter 234 of transistor 222 is connected to the base 236 of transistor 210. The base 240 of transistor 220 is pulled up through capacitor 242 during voltage increases and ESD events. The base 232 of transistor 222 is pulled up through transistor 220. The base 236 of transistor 210 is pulled up through transistor 222. The bases 240, 232 and 236 are pulled down during steady state operation through resistors 244, 246 and 250 to turn off transistors 220, 222 and 210. The timing of turning off transistors 220, 222 and 210 is affected by the time constant established by RC circuit 216. The turning on of transistors 220, 222 and 210 during an ESD event is staged to prevent false triggering during normal operation, with transistor 220 being turned on first, followed by transistor 222 and finally transistor 210. The areas of transistors 220, 222 and 210 may be graduated to control the staging and prevent false triggering, with transistor 220 being the smallest, followed by transistor 222, and with transistor 210 being the largest transistor. Protective diode-connected transistors 252 and 254 may be included in the ESD circuit 180 to protect against negative voltage fluctuations. When the ESD circuit 180 is triggered and the base 236 of transistor 210 is pulled up, ESD indicator signal 202 will be pulled up, turning on transistor 192 to disable the current stealing transistor 60.

A diode-connected transistor 260 may be included in the active clamp 262 to protect current stealing transistor 60 and diode-connected transistor 182 by preventing their base voltages from dropping too low below ground 42 when the output driver 10 switches off the current output 14. In some embodiments, diode-connected transistor 260 is an NPN BJT with the emitter 264 connected to the base 66 of current stealing transistor 60 and the base 266 and collector 270 connected to ground 42. By using an NPN BJT 260 with base 266 and collector 270 connected to ground 42, and emitter 264 at the inner N-doped semiconductor layer connected to node 272, most isolated from the grounded substrate, better latch-up performance is achieved compared with the alternative wiring in which collector 270 would be connected to node 272, and base 266 and emitter 264 to ground 42. In this configuration, diode-connected transistor 260 sinks less current into the substrate, reducing the potential to trigger a latch-up event in nearby CMOS circuitry. When the output transistor 16 is turned off to switch off the current output 14, the voltage at current output 14 drops and node 272 is AC coupled to current output 14 through feedforward capacitor 162, pulling down the voltage at node 272. This has the potential to cause a reverse $V_{BE}$ in current stealing transistor 60 and diode-connected transistor 182 which might deteriorate their performance. Transistor 260 clamps node 272 to ground 42, preventing negative voltage excursions and reverse $V_{BE}$ conditions.

In some embodiments, the areas of transistors 260 and 192 are smaller than that of diode-connected transistor 182, enabling them to operate more quickly than transistor 182 to disable the active clamp 262 during ESD events and negative voltage excursions at node 272.

Notably, any embodiment illustrated herein or adaptations thereof may be provided with ESD protection and adapted to disable the active clamp during ESD events, or with protective diodes such as transistor 260.

Figure 5:
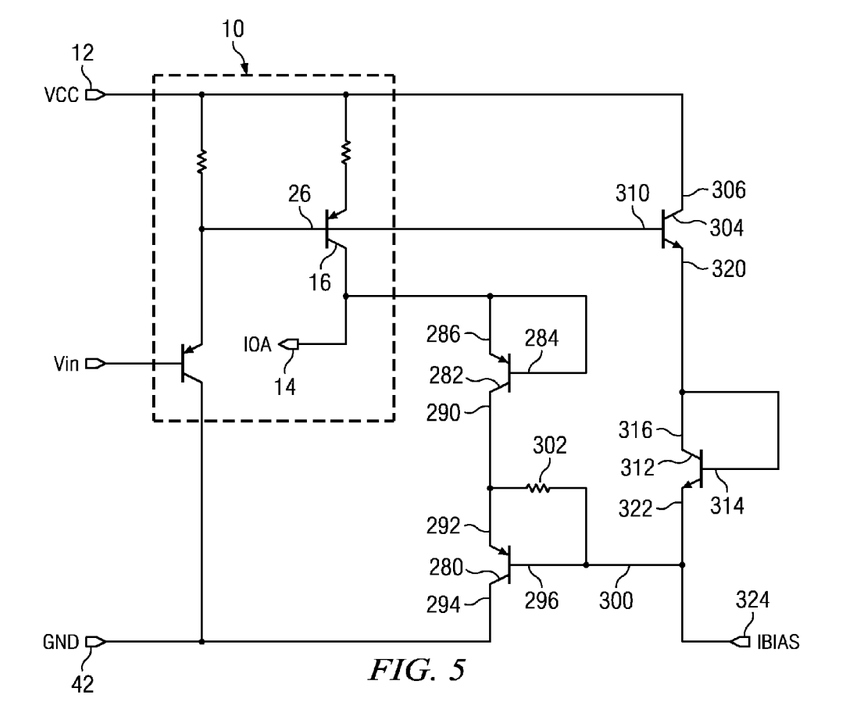
FIG. 5 depicts a current driver with an active clamp in accordance with some embodiments.

In the embodiment illustrated in FIG. 5, a PNP BJT current stealing transistor 280 is used to steal current from the current output 14 to damp voltage excursions. A diode-connected PNP BJT transistor 282 is connected at the base 284 and emitter 286 to the current output 14, and at the collector 290 to the emitter 292 of current stealing transistor 280. The collector 294 of current stealing transistor 280 is connected to ground 42, and the base 296 of current stealing transistor 280 is connected to a reference voltage node 300. A resistor 302 is connected between the emitter 292 and base 296 of current stealing transistor 280. An NPN BJT transistor 304 is connected at the collector 306 to the voltage supply 12 and at the base 310 to the base 26 of output transistor 16. A diode-connected NPN BJT transistor 312 is connected at the base 314 and collector 316 to the emitter 320 of transistor 304 and at the emitter 322 to reference voltage node 300. A bias current supply 324 that is adapted to track the current through current output 14 is connected to reference voltage node 300.

The current stealing transistor 280 is turned on when the voltage at current output 14 is higher than roughly the voltage at the base 26 of output transistor 16, as represented by the voltage at reference voltage node 300. When biased by bias current supply 324, the transistor 304 operates as a level shifter, with the base to emitter voltage of transistor 304 shifting the voltage at the base 26 of output transistor 16 down to set the voltage at the reference voltage node 300 relative to the voltage at the base 26 of output transistor 16. Diode-connected transistors 282 and 312 are provided to protect and prevent the breakdown of current stealing transistor 280. Bias current supply 324 is adapted to track the current through current output 14 using any suitable device or circuit, such as a current mirror. In some embodiments, bias current supply 324 tracks the current through current output 14, providing a current linearly proportional to the current through current output 14. In yet other embodiments, bias current supply 324 may be set to a fixed or varying current level as desired to establish the maximum clamp current through current stealing transistor 280. The current stealing transistor 280 functions in a class-A type of operation, with the maximum clamp current through current stealing transistor 280 limited by the current through bias current supply 324 multiplied by its gain factor. The maximum current that can be provided by current stealing transistor 280 is roughly its current gain factor $\beta$ times the IBIAS current from bias current supply 324. Therefore, if the maximum current through current stealing transistor 280 is IMAX, then IBIAS is IMAX/$\beta$. In some embodiments, some margin left in the current level through current stealing transistor 280.

Figure 6:
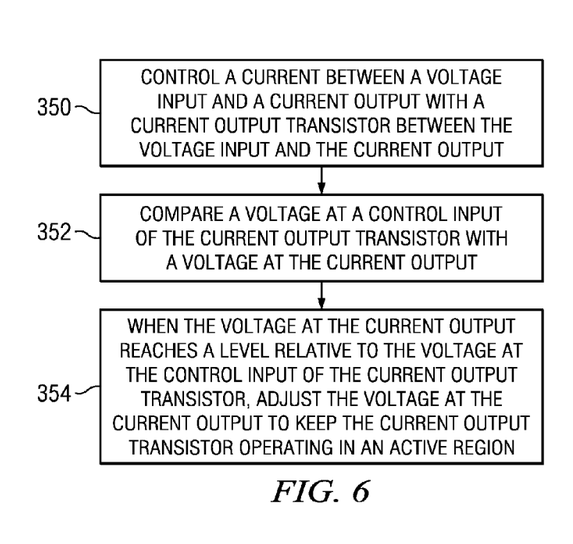
FIG. 6 depicts a flow diagram of a method for supplying electrical current in accordance with some embodiments.

When the voltage at current output 14 rises during overshoot, the emitter 292 of current stealing transistor 280 is pulled up, effectively pulling the base 296 low with respect to the emitter 292 and turning on current stealing transistor 280. As discussed above, this steals current from current output 14 and damps the voltage at current output 14. In some other embodiments discussed above, the current stealing transistor 60 comprised an NPN BJT transistor with the emitter tied and referenced to ground and with the base pulled up in response to voltage overshoot at the current output 14. In the embodiment of FIG. 6, the current stealing transistor 280 comprises a PNP BJT transistor with the base 296 referenced to the voltage at the base 26 of output transistor 16 and with the emitter pulled up in response to voltage overshoot at the current output 14. Various embodiments of the current driver damping circuit may be adapted to these and other configurations. As discussed above, the current driver damping circuit may be adapted to various types and polarities of transistors and is not limited to the example embodiments illustrated and described herein.

Resistor 302 is selected to have a relatively large value in order to act as an open circuit during AC events such as ringing and overshoot, allowing the emitter 292 of current stealing transistor 280 to be temporarily pulled up with respect to base 296. During steady state operation, resistor 302 pulls the emitter 292 and base 296 closer to the same voltage level, turning off current stealing transistor 280 during normal operation to prevent current loss through current stealing transistor 280 during normal operation in the absence of AC events.

While a number of example embodiments have been presented herein, these embodiments may be adapted as desired based on operating conditions and requirements, for example by combining selected portions of the embodiments presented herein. Factors that may be considered when selecting and adapting embodiments include the voltage drop across loads such as a laser diode, the severity of ringing, required rise time, etc. More complex embodiments such as those including a differential amplifier provide a more controlled solution, while embodiments omitting a differential amplifier may be simpler, smaller and cheaper, enabling the designer to balance resources and operating requirements.

A method for supplying electrical current is illustrated in the flow diagram of FIG. 6. The method may be performed in any suitable devices, such as in the example circuits described above or in other circuits. The method includes controlling the current between a voltage input and a current output using a current output transistor connected between the voltage input and the current output. (Block 350) In some embodiments, the current at the current output is either turned on or off in digital fashion by switching the current output transistor on and off. In other embodiments, the current at the current output may be varied in analog fashion by controlling the current output transistor, for example by controlling the base current in BJT current output transistors. The method also includes comparing the voltage at a control input of the current output transistor with a voltage at the current output (block 352), and when the voltage at the current output reaches a level relative to the voltage at the control input of the current output transistor, adjusting the voltage at the current output to keep the current output transistor operating in an active region. (Block 354) The voltage comparison may be performed actively, using amplifiers or other comparators, or passively, using feedforward capacitors or other techniques. The voltage comparison may be performed directly on the voltages at the control input of the current output transistor and at the current output, or indirectly, using reference voltages provided by active circuits such as current mirrors or passive circuits such as level shifters. The adjustment of the voltage at the current output to keep the current output transistor operating in an active region may be a voltage adjustment in the positive or negative directions, as suitable based on the circuit topology and transistor polarities, and may be performed in any suitable manner. For example, a current sink may be used to draw current away from the current output, reducing the current through the current output and thereby reducing the voltage at the current output. The voltage level at which the current output voltage is based on the circuit topology and is set at the level needed to prevent the current output transistor from entering the saturation region. For example, given a PNP BJT output transistor, the current output voltage may be adjusted when the collector voltage meets or exceeds the base voltage in the output transistor. The method may include deactivating or turning off current output voltage adjustment during steady state operation, so that current through the current output is affected only during AC events such as ringing but not during steady state or DC operation. In some embodiments, the method may include sensing ESD events and disabling or inhibiting the current output voltage adjustment during ESD events, thereby preventing false triggering of current output voltage adjustments.

The current driver damping circuits disclosed herein, including various embodiments of active clamps and their variations, may be adapted for use with any current driver and application. For example, a current driver with active clamp may be used in a laser diode driver to power the optical pick-up unit in an optical media storage device such as a CD or DVD reader or writer. Such an application derives particular benefit from the current driver damping circuits disclosed herein, due to the flex cables extending between the laser diode driver often provided on the circuit boards of the optical media storage device and the optical pick-up unit which is provided in a movable carriage adjacent the motorized spindle in the optical disk tray. The flex cables and movable carriage enable the optical pick-up unit to be moved radially between the inner and outer edges of the optical disk as the motorized spindle spins the disk, enabling the optical pick-up unit to be positioned over and access any region of the disk. The flex cables typically have a relatively large characteristic impedance, contributing to ringing at the output of the laser diode driver. The damping circuits including the active clamps disclosed herein, and their variations, damp voltage excursions at the output of the laser diode driver and enable the output device in the laser diode driver to operate in the active region rather than in the slower saturation region. The current driver damping circuits may also be used to provide similar benefits in other applications requiring current drivers.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. An apparatus for supplying current, the apparatus comprising:
    an output transistor connected between a voltage supply and a current output; and
    an active clamp connected between the current output and a current sink, wherein the active clamp is adapted to connect the current output to the current sink when a voltage at the current output reaches a predetermined state relative to a voltage at a control input of the output transistor,
    wherein the active clamp comprises a second transistor connected between the current output and the current sink,
    wherein the active clamp further comprises a capacitor connected between the current output and a control input of the second transistor, and
    wherein the active clamp further comprises a diode-connected transistor connected in series with the capacitor, wherein the second transistor and the diode-connected transistor have different emitter areas.

2. The apparatus of claim 1, wherein the active clamp is adapted to connect the current output to the current sink when the voltage at the current output is greater than or equal to the voltage at the control input of the output transistor.

3. The apparatus of claim 1, wherein the predetermined state comprises a state that causes the output transistor to operate in a saturation mode.

4. The apparatus of claim 1, wherein the current sink comprises a ground, the apparatus further comprising:
- a resistor connected between the voltage supply and the current output, and
- a buffer connected to the control input of the output transistor.

5. The apparatus of claim 1, wherein the active clamp further comprises an amplifier connected to the current output and to the control input of the output transistor, the amplifier having an output connected to a control input of the second transistor.

6. The apparatus of claim 1, wherein the amplifier comprises a current mirror connected to a reference voltage generator, wherein the reference voltage generator tracks the voltage at the control input of the output transistor.

7. The apparatus of claim 1, wherein the active clamp further comprises a resistor connected between the control input of the second transistor and the current sink.

8. The apparatus of claim 1, wherein the active clamp further comprises a second diode-connected transistor connected between the control input of the second transistor and the current sink, and wherein an emitter of the second diode-connected transistor is connected to the control input of the second transistor.

9. The apparatus of claim 1, wherein the second diode-connected transistor comprises an NPN transistor, and wherein the emitter of the second diode-connected transistor comprises an inner N-doped semiconductor layer.

10. The apparatus of claim 1, wherein the active clamp further comprises an electrostatic discharge protection circuit, and wherein the electrostatic discharge protection circuit is operable to disable the active clamp during an electrostatic discharge event.

11. The apparatus of claim 1, wherein the active clamp further comprises:
- a resistor connected between a base and an emitter of the second transistor;
- a level-shifting transistor connected between a control input of the second transistor and the control input of the output transistor; and
- a bias current supply connected to the control input of the second transistor.

12. A method for supplying electrical current, the method comprising:
- controlling a current between a voltage input and a current output with a current output transistor between the voltage input and the current output;
- comparing a voltage at a control input of the current output transistor with a voltage at the current output; and
- when the voltage at the current output reaches a level relative to the voltage at the control input of the current output transistor, adjusting the voltage at the current output to keep the current output transistor operating in an active region,
- wherein an active clamp of the active region comprises both a first transistor and a second transistor connected between the current output and the current sink,
- wherein the active clamp further comprises a capacitor connected between the current output and a control input of the second transistor, and
- wherein the active clamp further comprises a diode-connected transistor connected in series with the capacitor, wherein the second transistor and the diode-connected transistor have different emitter areas.

13. The method of claim 12, wherein adjusting the voltage at the current output comprises lowering the voltage at the current output by sinking current from the current output.

14. The method of claim 12, further comprising inhibiting the adjustment of the voltage at the current output during an electrostatic discharge event.

15. The method of claim 12, wherein the adjustment of the voltage at the current output is deactivated during steady state operation.

16. An optical media storage device comprising:
- an optical pick-up unit; and
- a current supply connected to the optical pick-up unit, wherein the current supply comprises:
  - an output transistor connected between a voltage supply and a current output; and
  - an active clamp connected between the current output and a current sink, wherein the active clamp is operable to prevent the output transistor from entering a saturation region.

17. The optical media storage device of claim 16, wherein the active clamp is operable to connect the current output to the current sink when a voltage at the current output is greater than or equal to a voltage at a control input of the output transistor.

18. An apparatus for supplying current, the apparatus comprising:
- a resistor connected to a voltage supply;
- an output transistor connected between the resistor and a current output;
- a clamp transistor connected between the current output and a ground;
- a reference voltage generator operable to generate a reference voltage that tracks a control voltage at a control input of the output transistor;
- an amplifier connected to the control voltage and to the reference voltage, the amplifier having an output connected to a control input of the clamp transistor;
- a capacitor connected between the current output and the control input of the clamp transistor;
- a diode-connected NPN transistor connected at an emitter to the control input of the clamp transistor and at a source to the ground, wherein the emitter of the diode-connected NPN transistor comprises an inner N-doped semiconductor layer;
- an electrostatic discharge protection circuit, wherein the electrostatic discharge protection circuit is operable to disable the clamp transistor during an electrostatic discharge event by connecting the control input of the clamp transistor to the ground; and
- wherein the clamp transistor is operable to connect the current output to the ground when a voltage at the current output reaches a level relative to the control voltage at which the output transistor operates in a saturation mode.

* * * * *